United States Patent [19]

Coleman

[11] Patent Number: 4,741,801

[45] Date of Patent: * May 3, 1988

[54] GLOW DISCHARGE METHOD AND APPARATUS AND PHOTORECEPTOR DEVICES MADE THEREWITH

[75] Inventor: John H. Coleman, Locust Valley, N.Y.

[73] Assignee: Plasma Physics Corp., Locust Valley, N.Y.

[*] Notice: The portion of the term of this patent subsequent to Feb. 11, 2003 has been disclaimed.

[21] Appl. No.: 827,022

[22] Filed: Feb. 7, 1986

Related U.S. Application Data

[60] Continuation-in-part of Ser. No. 637,065, Aug. 2, 1984, Pat. No. 4,569,719, which is a division of Ser. No. 284,333, Jul. 17, 1981, Pat. No. 4,484,809.

[51] Int. Cl.[4] .................... B44C 1/22; H01L 21/306; B05D 3/06; G03G 15/00
[52] U.S. Cl. .................... 156/643; 118/50.1; 118/620; 118/725; 118/730; 156/345; 156/646; 156/662; 204/192.1; 204/192.37; 204/298; 350/330; 350/339 F; 355/3 DR; 427/39; 428/1; 428/446
[58] Field of Search ............... 156/643, 646, 345, 662; 350/330, 339 F; 118/50.1, 620, 724, 725-730; 427/39; 428/1, 446; 204/164, 192 EC, 192 E, 298, 192.1, 192.23, 192.25, 192.37; 355/3 DR; 357/29.30; 437/2, 228, 235

[56] References Cited

U.S. PATENT DOCUMENTS 4,569,719 2/1986 Coleman .................... 156/662 X

Primary Examiner—William A. Powell

[57] ABSTRACT

Glow discharge method and apparatus useful for coating photoresponsive devices in the form of drums and plates are described. Improved photoresponsive devices using amorphous silicon which accepts a high surface voltage in the dark and discharges to a low residual voltage under illumination are also described.

27 Claims, 4 Drawing Sheets

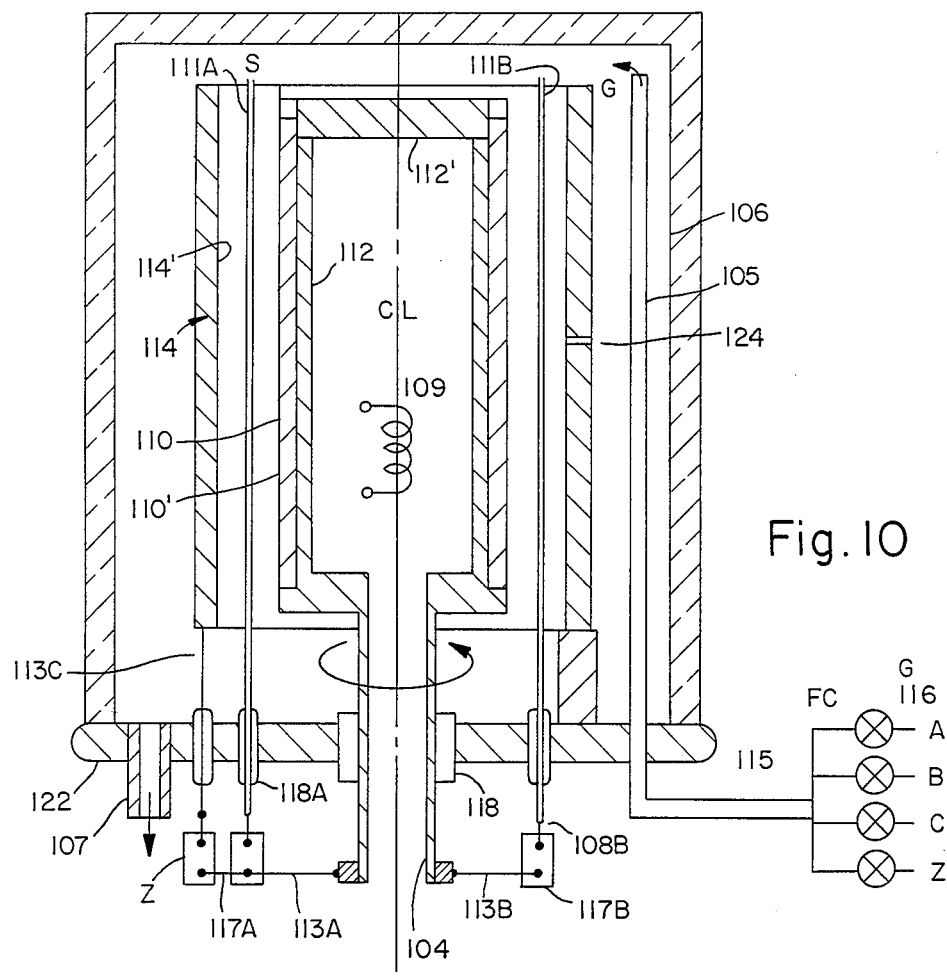

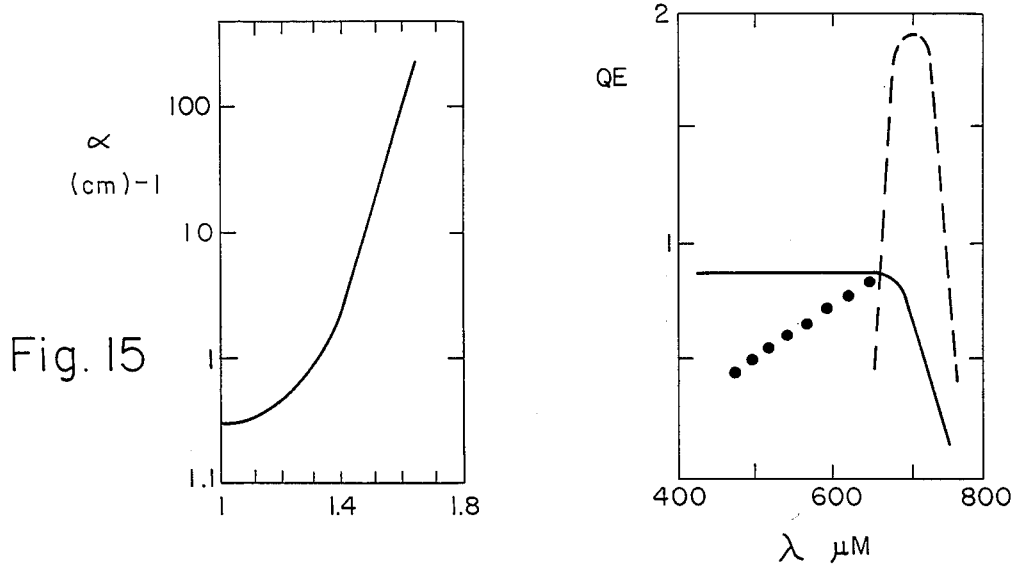
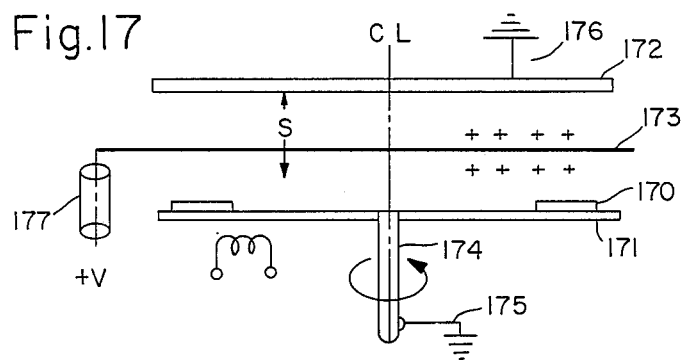
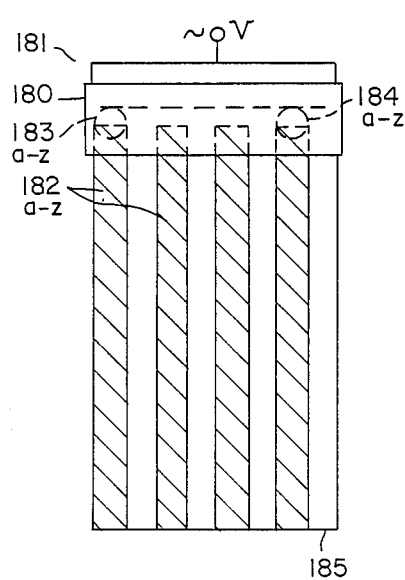
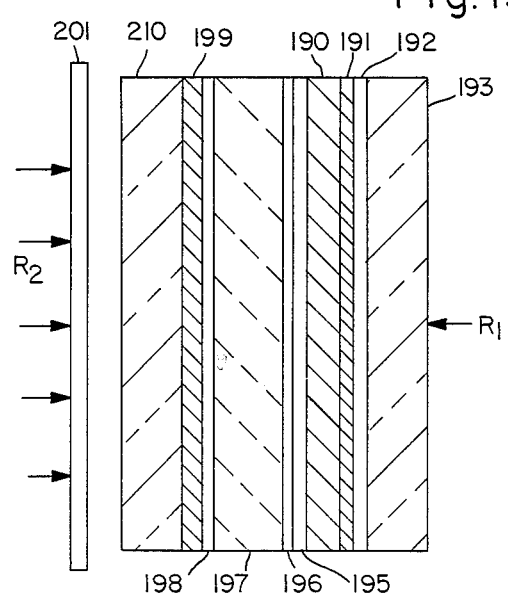

GLOW DISCHARGE METHOD AND APPARATUS AND PHOTORECEPTOR DEVICES MADE THEREWITH

This is a continuation-in-part of application Ser. No. 06/637,065, filed Aug. 2, 1984, now U.S. Pat. No. 4,569,719 which is a divisional application of application Ser. No. 06/284,333, field Jul. 17, 1981, now U.S. Pat. No. 4,484,809.

BACKGROUND OF THE INVENTION

This invention relates broadly to photoreceptors for electrophotography and more particularly to improved photoreceptors which are composed of amorphous silicon having a dielectric layer which increases the surface voltage in the dark while reducing residual voltage under illumination.

The photoreceptor utilizing hydrogenated amorphous silicon (a-Si:H) and a dielectric layer described above is an improvement over a photoreceptor described in my patent application Ser. No. 06/138,699, now U.S. Pat. No. 4,330,182 a continuation-in-part of U.S. Pat. No. 4,226,897 in which blocking layers were disclosed.

In the past, prior art devices described in U.S. Pat. No. 4,225,222, which issued Sept. 30, 1980, to Kempter, described p-n junctions in amorphous silicon for electrophotography. Other amorphous photoreceptors were described by Mort et al in *Photographic Science and Engineering*, Vol. 24, No. 5, pages 241-250. Also, UK patent application No. 2,018,466A filed Mar. 2, 1979 by Misumi et al and U.S. Pat. No. 4,265,991 which issued May 5, 1981 to Hirai, described blocking layers on imaging-forming members. Other blocking layers on amorphous silicon photoreceptors were described by Shimizu, Komatsu and Inoue in *Photographic Science and Engineering*, Vol. 24, No. 5, Sept. 1980, in pages 250-254. These blocking layers increased the dark surface voltage ($V_s$) but retained substantial surface charge under illumination, thereby reducing voltage contrast.

Apparatus suitable for the present invention using asymmetrical electrical fields is described in my above-mentioned U.S. Pat. No. 4,226,897. Suitable apparatus with uniform electrical fields is described in my U.S. Pat. No. 3,069,283. Improved apparatus is described herein.

Other electro-optic devices for electrostatic printing from digital data are described by U.S. Pat. No. 3,466,657 to Rice and No. 3,471,861 to Macovski which utilize a photoconductor to switch a high voltage to an array of wires. Also, an article by Bleha entitled "Progress in Liquid Crystal Light Valves" in *Laser Focus/Electro Optics*, Oct. 1983, pages 111-120, describes the use of a photoconductor activated by a cathode ray tube (CRT) as a switching element for a liquid crystal light valve. In both devices the photoconductor represents the limits of performance. Space charge limited currents in photoconductors under dark and light conditions were formulated by A. Rose in *Physical Review*, Vol. 97, 1955, page 1531. Such electro-optic devices are improved in performance by the use of hydrogenated amorphous silicon (a-Si:H) described herein, and Rose's own analysis is helpful in understanding the underlying principles.

Finally it is relevant to note in my U.S. Pat. No. 3,068,283 mentioned above and in my U.S. Pat. No. 3,088,510 (Dec. 18, 1962) that metallic contacts were applied to films deposited by glow discharge from gases including $SiF_4$ (i.e. fluorinated amorphous silicon a-Si:F). Chittick in the *Journal of Non-Crystalline Solids*, 3 (1970), pages 255-270, and Chittick, Alexander & Sterling in *Journal of the Electrochemical Society* Vol 116, No. 1 (1969), pages 77-81, suggested that such metallic contacts on a-Si:H form Schottky barriers, i.e. depletion of the a-Si:H under the contact and a junction current effected the polarity of the applied voltage. Metallic contacts are useful in one embodiment of my invention.

SUMMARY OF THE INVENTION

In a series of experiments, I found that when I applied a thin dielectric layer to an a-Si:H photoreceptor by exposing the a-Si:H to activated species of nitrogen using, for example, the method described in my above mentioned U.S. Pat. No. 4,226,897, the dark $V_s$ was increased significantly while the $V_s$ due to residual charge after exposure was reduced to a low value. Although a nitride layer on a-Si:H was found previously to increase the Schottky barrier voltage by a few millivolts, I found that the increase in $V_s$ was in excess of ten volts and higher when the nitride layer was applied to the surface of an a-Si:H photoreceptor. In the preferred embodiment, I found that improved photoreceptor properties resulted when a dielectric layer was applied between semiconductor layers. The dielectric layer, when formed either by activated nitrogen species or by a glow discharge in silane and ammonia, was blocking to charge carriers flowing in the dark, but was substantially conducting to charge carriers generated by electromagnetic radiation analagous to a rectifier. The semiconductor layers included p-doped, n-doped, and intrinsic layers of a-Si:H.

Furthermore, a photoreceptor was produced capable of both positive and negative charging by applying a P-doped a-Si:H layer, nitride of silicon layer, and intrinsic layer sequentially to an aluminum drum. When the photoreceptor drum was substituted for a selenium alloy drum in a commercially available electrostatic office copier with liquid toner, high quality image reproduction was attained. The image resolution was exceptionally high since there is no detectable grain in the a-Si:H, and the residual charging was low. Also, other problems were eliminated which are usually associated with photoreceptors, such as, for example, reverse charging when its surface area was brushed to remove toner during the cleaning cycle.

In addition, improved apparatus is described herein which is particularly useful for plasma coating photoreceptor drums and tape in production quantities.

Thus, one object of the present invention is to increase the dark surface voltage accepted by a photoreceptor composed of a-Si:H. Another object is to reduce the residual charge on an a-Si:H photoreceptor under illumination. Still another object is to provide an improved electrophotographic system. Also an objective is to provide a rectifying barrier in a photoreceptor which is blocking to charge flowing in the photoreceptor while in the dark, and is conducting to charge generated under illumination. Finally, another object is to provide improved glow discharge process and apparatus having high deposition rates.

Another object is to provide an improved electro-optic switch capable of high data rates. Another object is to provide an improved photoconductor for a liquid crystal light valve.

BRIEF DESCRIPTION OF THE DRAWINGS

Reference is now made to the drawings in which:

FIG. 10 is a side view in cross-section illustrating another embodiment of glow discharge apparatus for coating cylindrical drums.

FIG. 11 is a side view in cross-section of an amorphous silicon photoreceptor made in the apparatus of FIG. 10.

FIG. 12 is a side view in cross-section of another embodiment of an amorphous silicon photoresponsive device made in the apparatus of FIG. 10.

FIG. 13 is a graph on a log-log scale of photocurrents I vs applied voltage V for two amorphous silicon samples A, B FIG. 14 is a graph on a log-log scale of photocurrent I vs time T after removal of illumination.

FIG. 15 is a graph on a semi-log scale of optical absorption vs photon energy E for amorphous silicon sample A.

FIG. 16 is a graph of quantum efficiency QE vs wave length for amorphous silicon sample A.

FIG. 17 is a schematic drawing of a side view of glow discharge apparatus for coating semiconductor wafers.

FIG. 18 is a top view of an a-Si:H electro-optic switch using an LED array.

FIG. 19 is a schematic drawing of a side view of a liquid crystal light valve using an amorphous silicon photoconductor.

DESCRIPTION OF THE APPARATUS AND TECHNIQUES

Figure 1:
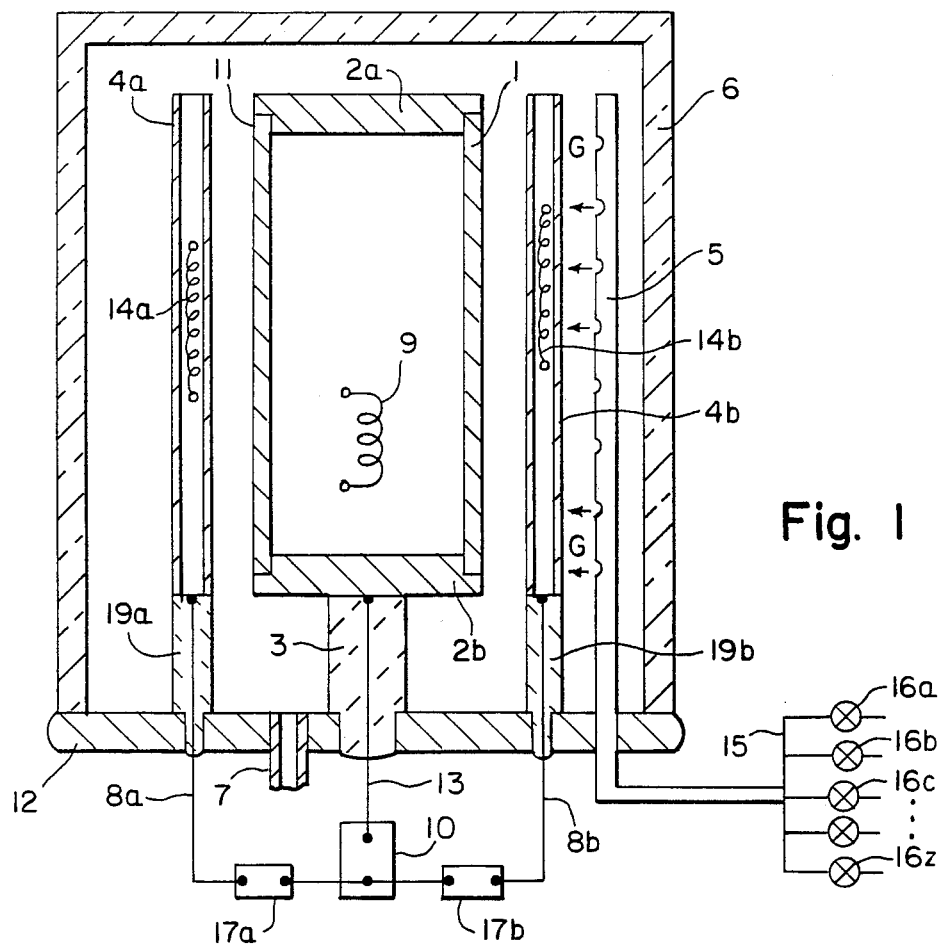
FIG. 1 is a side view in cross-section illustrating schematically the glow discharge apparatus for coating cylindrical drums.

Referring to FIG. 1, a cross-sectional view is illustrated schematically of glow discharge apparatus positioned on a header plate 12 which is hermetically sealed to an enclosure 6. Substrate 1 is a cylindrical drum of aluminum having an outer surface 11 to be coated. End discs 2a, b, are fitted into the open ends of cylindrical substrate 1. Disc 2b is mounted on center conductor 13 of ceramic post 3 which electrically connects the substrate 1 to the negative terminal of a power supply 10. Ceramic post 3 is hermetically sealed into header 12. Counter electrodes 4a, b of, say, stainless steel tubing, are supported by ceramic posts 19a, b respectively, posts 19a, b being hermetically sealed into header 12. The center conductors 8a, b of posts 19a, b electrically connect the counter electrodes 4a, b respectively to the positive terminal of power supply 10 through protective impedances 17a, b respectively. Heating element 9 mounted inside cylindrical substrate 1 is electrically connected through suitable terminals (not shown) in header 12 to an external power source (not shown).

Next, as illustrated in FIG. 1, gases G from gas supply tanks (not shown) are introduced into enclosure 6 through appropriate flow controllers 16a, b . . . z, then through line 15, hermetic fitting 14 in header 12, and line 5. Enclosure 6 is evacuated through tubing 7 by a vacuum pump (not shown).

In operation, the atmosphere in enclosure 6 is evacuated through tubing 7 to a pressure of about 0.1 Torr or less and the enclosure 6 is back-filled with the desired film-forming gases G. Various coatings may be produced in the apparatus of FIG. 1 such as, for example, the photoreceptor illustrated in FIG. 2.

Figure 2:
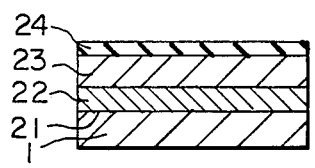
FIG. 2 is a side view in cross-section of one embodiment of an amorphous silicon photoreceptor of exaggerated thickness made with the apparatus of FIG. 1.

Referring now to FIG. 2, which illustrates cross-sectionally a photoreceptor coated, for example, on the aluminum drum substrate 1 illustrated in the apparatus of FIG. 1. Here the substrate surface 21 is coated first with an n-type layer 22 of a-Si:H using gases G consisting of a mixture of silane ($SiH_4$) and phosphine ($PH_3$). The P/Si mixture, which is in the ratio of 0.01% to 1% or greater, is admitted into line 5 by adjusting the mass flow controllers 16a, b. The gases G may be diluted, for example, to 5% $SiH_4$ in He and 1% $PH_3$ in He and operated in the pressure range of 1 to 3 Torr. The temperature of substrate 1 is maintained at 230° C. or higher by adjusting the current to heater 9. Counter electrodes 4a, b may be 200° C. or higher by adjusting heaters 14a, b to increase the electrical conductivity of the material deposited on the surfaces of counter electrodes 4a, b during deposition which would otherwise impede the flow of current from the plasma to the anodes 4a, b. The layer 22 may be coated to 300 Å and thicker by adjusting voltage V to about 360 volts and maintaining a current density of 0.1 mA $cm^2$ for about one minute or longer.

Next, the phosphine flow valve 16b is closed and the $SiH_4$ continues to form an intrinsic a-Si:H layer 23 to attain the desired thickness, dependent on the desired operating voltage. Finally, the $SiH_4$ valve 16a is closed and the enclosure 6 is evacuated. $NH_3$ is admitted next through valve 16c to a pressure of about 0.2 Torr and the flow discharge continued for about 30 minutes with power source 10 adjusted to 300 volts and the current I of 0.1 mA/$cm^2$ and higher, thereby forming a nitride of silicon layer 24 in a similar manner to that described in my above mentioned U.S. Pat. No. 4,226,897.

Under test using a one micron thick a-Si:H layer 23, the surface voltage $V_s$ charged to $-30$ volts in the dark with a conventional Corotron corona charger. No positive charging was noted. Without the nitride layer 24, $V_s$ charged to only about $-15$ volts with the same thickness of a-Si:H layer 22. Next, under illumination of 0.2 microjoules at 550 nm, the $V_s$ decreased to approximately zero. Finally, the substrate drum 1 was removed and inserted into a commercially available electrophotographic office copier in place of the conventional selenium drum. When the drum 1 was negatively charged, exposed, and developed with liquid toner by the Carlson method, it produced high quality toned images which transferred to standard paper.

Thus, in the dark, the nitride layer appears to block the flow of holes from the aluminum substrate as well as to block the holes which are generated thermally in the a-Si:H layer from flowing to the surface. Significantly, the charge carriers generated by illumination appear to tunnel through nitride layer 24 and discharge the $V_s$ to a low value, indicating that the dielectric layer possesses rectification properties.

Figure 3:
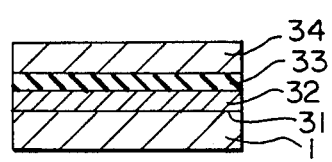
FIG. 3 is a side view in cross-section of a second embodiment of an amorphous silicon photoreceptor of exaggerated thickness.

Next, referring to FIG. 3, a photoreceptor is illustrated cross-sectionally having a surface 31 of the substrate 1 which, for example, may be the aluminum drum illustrated in FIG. 1. First a p+ layer 32 is deposited on surface 31 in the apparatus of FIG. 1 having a B/Si ratio preferably in the range of 0.01% to 1% with a thickness range of 300 to 10,000 Å. During deposition the temperature is maintained in the range of 250° to 450° C. The higher temperatures are preferred initially for best adhesion to the substrate surface 31, after which the temperature is preferably reduced to 250° C. At the higher temperatures, chemical vapor deposition (CVD) was noted to occur by pyrolysis on substrate surface 31 and, indeed, suitable p+ layers 32 were produced at 450° C. without applying the glow discharge. A nitride of silicon layer 33 was then produced on p+ layer 32 by a glow discharge in NH₃ for 30 minutes, as described above. Finally, the temperature of substrate 1 was held at 250° C. and an intrinsic a-Si:H layer 34 of about 5 microns thickness was plasma deposited on the nitride layer 33 by a glow discharge in silane, thereby forming the sequence: Intrinsic a-Si:H/ dielectric/p+a-Si:H.

Under test, the photoreceptor illustrated in FIG. 3 with a 5 micron thick intrinsic a-Si:H layer 34 charged to $V_s$ of +80 volts. Surprisingly, the same photoreceptor charged $V_s$ to −110 volts. Both polarities of $V_s$ discharged to a few volts under illumination of 2 microjoules at 550 nm. Without the nitride layer 33, $V_s$ on layer 34 charged in the dark to less than +25 volts, and charged negatively to only a few volts. The dielectric layer 33 appears to block charge carriers present in the dark, while to be conducting to charge carriers generated by electromagnetic radiation when charged to either polarity. Thus, the dielectric film has properties analagous to a rectifier, except that the effect is independent of polarity.

Indeed, a top semitransparent electrode of Cr was evaporated on the intrinsic a-Si:H layer 34 to form a photodiode structure; and, when an external voltage of 10 volts was applied between the semitransparent electrode and substrate, the charge carriers flowing in the dark were less than a microamp, whereas under illumination several milliamps were measured.

Next, the gases G containing a mixture of silane and NH₃ were admitted simultaneously during the glow discharge forcing a $Si_xN_y$ dielectric film. The discharge was maintained for about 6 minutes to deposit a 1000 Å $Si_xN_y$ layer 33 on p-layer 32. Similar dark $V_s$ and illuminated discharge values were obtained to those described above when the dielectric layer 33 was produced by discharging in NH₃ alone.

In addition to producing positive and negative charging, the photoreceptor illustrated in FIG. 3 is the preferred embodiment of the invention, since the dielectric layer 33 is positioned between two semiconductor layers and, therefore, dielectric layer 33 is protected from the mechanical wear involved during the toning, image transfer, and cleaning cycles of the Carlson process. Also under test in a commercial electrophotographic copy machine, high quality images were produced.

Figure 4:
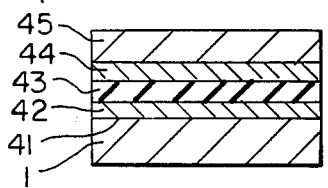
FIG. 4 is a side view in cross-section of a third embodiment of an amorphous silicon photoreceptor.

Referring to FIG. 4, a p-type layer 42 is applied to the surface 41 of substrate 40, after which a $Si_xN_y$ layer 43 is applied to the surface of layer 42, as described in connection with FIG. 3. An n-type layer 44 in the range of 300 to 10,000 Å thick was applied to the surface of a $Si_xN_y$ *layer 43 and an intrinsic a-Si:H layer 45 applied to the layer 44. Thus the photoreceptor had the layers applied sequentially: intrinsic a-Si:H/n a-Si:H/dielectric/p a-Si:H/metal substrate.*

Under corotron charging, negative $V_s$ of −20 volts was accepted by layer 44 of one micron thickness. No positive charging was observed since the negative majority carriers in the n-type layer in layer 44 drift to a positive charge. However, the dielectric layer 43 increased the $V_s$ by blocking holes from the p-layer and from the substrate 11. Again, there is no residual voltage under illumination since the photo-induced charge carriers appear to tunnel through dielectric layer 42.

Figure 5:
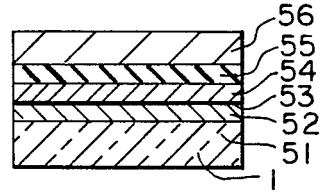
FIG. 5 is a side view in cross-section of an amorphous silicon photoreceptor deposited on a semi-transparent substrate.

Now, referring to FIG. 5, the substrate 1 is a glass plate 51 with a semi-transparent, conducting-metal-oxide coating 52 composed of, for example, fluorinated tin oxide 1500 Å thick. The coating 52 may be coated with a protective layer 53 of 30 Å silicon oxide formed by oxidizing a plasma deposited a-Si:H layer.

Next, with the substrate 1 held at 250° C. the layers described in connection with FIG. 3 were applied sequentially to the oxide layer 53; i.e., a p-type a-Si:H layer 54, a nitride layer 55, an intrinsic a-Si:H layer 56.

In operation the photoreceptor illustrated in FIG. 5 charged to $V_s$ of +50 volts and −70 volts in the dark and discharged to a low value under illumination as low as 0.2 microjoules/cm² when the thickness of the intrinsic a-Si:H layer 56 was similar to that described in connection with FIG. 3.

The devices illustrated in FIGS. 2-5 were next plasma deposited in the apparatus illustrated in my U.S. Pat. No. 3,069,283 using a uniform electric field, and similar results were found to those described above. Also, the silane used to produce the intrinsic, n-type, and p-type layers was replaced with the following gases: disilane, fluorosilane, and fluorodisilane. In each case the photoreceptor produced similar results under test to those obtained with silane-He mixture. Also, when the power source 10 illustrated in FIG. 1 was charged to 60 Hz, audio frequencies from 60 to 20 KHz or radio frequencies from 20 KHz to 200 MHz and photoreceptors were produced such as illustrated in FIGS. 2-5, similar results were found. Finally, a-Si:H produced by sputtering or evaporating Si in a hydrogen atmosphere gave similar results.

Figure 6:
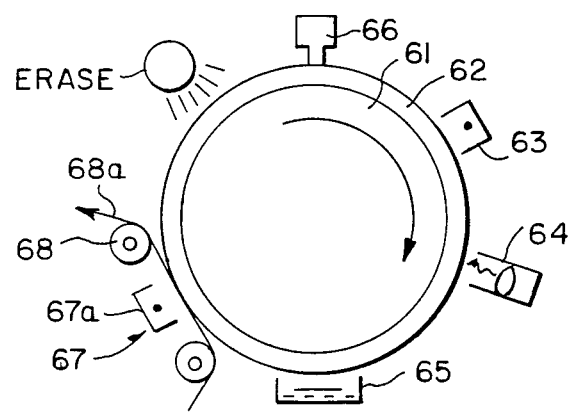
FIG. 6 is a side view in cross-section of an electrophotographic copy machine using the amorphous silicon photoreceptor of FIG. 3.

Referring to FIG. 6, a cross-sectional view of an electrostatic copier particularly suited to the present photoreceptor is illustrated schematically. A rotating drum 61 mounted on an appropriate shaft moves the a-Si:H photoreceptor 62 produced, for example, as described in connection with FIG. 3. Positioned around the periphery of drum 61 are corotron charging unit 63, exposure station 64, toner development system 65 with its development electrode adjusted to the appropriate potential, paper transfer station 67 with appropriate transfer corona 67a, and cleaning station 66. Paper feed rollers 68 hold the paper 68a against the drum under the transfer corona station 67 as is well known in the art. An erase lamp may be used as illustrated.

In operation with an a-Si:H photoreceptor such as described in connection with FIG. 3, high quality images were obtained with a $V_s$ as low as 80 volts when a typewritten letter was imaged onto the surface of photoreceptor 62. When an insulating Mylar belt was added to the surface of photoreceptor 62 and a corona charger (not shown) was added to the exposure station, good images were obtained for $V_s$ as low as 50 volts.

Next, referring to the exposure station 64, the optics for imaging a page onto photoreceptor 64 were removed and a He-Ne laser (not shown) was installed in the exposure station 64 and raster scanned across the a-Si:H surface 61, while being modulated with an accousto-optic modulator in accordance with a data stream, as is known in the art. Again, high resolution spots or images were transferred to the paper with a conventional treated surface for liquid toner. Both analog images and digital spots were recorded successfully.

Figure 7:
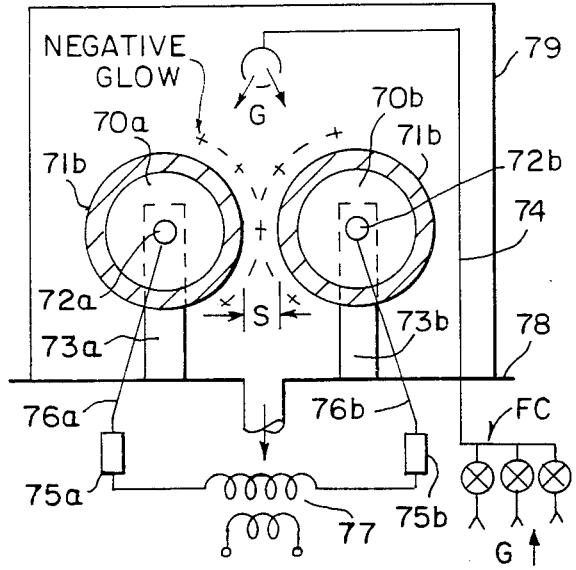
FIG. 7, 7A are side views in cross-section illustrating schematically glow discharge apparatus for coating cylindrical drums.

Finally, referring to FIG. 7, a cross-sectional view of glow discharge apparatus mounted in enclosure 79 hermetically sealed to header 78 is illustrated schematically. A pari of drum electrodes 70a, b are connected by leads 76a, b respectively to an electrical transformer 77. Electrodes 71a, b alternatively function as anode and cathode during each half cycle of the voltage induced on transformer 77. Drum electrodes 70a, b are supported by shafts 72a, b mounted in bearings (not shown) which are supported on the header plate 78 by insulated blocks 73a, b respectively. Drums 70a, b have surface 71a, b to be plasma coated from film-forming gases. The transformer 77 is connected to the drums 70a, b through protective impedances 75a, b and leads 76a, b which may be conveniently connected to the shafts 72a, b respectively through bearings (not shown) or other sliding contacts. Film-forming gases G are introduced as illustrated into the vicinity of drums 70a, b from line 74 and appropriate flow controllers FC and feed tanks (not shown).

Operation of the deposition system of FIG. 7 is similar to that of FIG. 1 in that the film forming gases are introduced into the region of the drum surfaces 71a, b through line 74 and flow controllers FC from tanks (not shown), after which the voltage from transformer 77 is adjusted to maintain a glow-discharge with the desired current density ranging from 0.1 mA/cm$^2$ and higher. However, both electrodes 70a, b have substrate surfaces 71a, b to which the coatings are applied on alternate cycles, thereby eliminating the necessity for a counter electrode which otherwise would wastefully collect some deposit. The frequency of the power from a power source (not shown) applied to transformer 77 may be in the range of 60 Hz to 100 MHz with appropriate matching networks. The drums may be rotated by an external motor (not shown) and drive shafts (not shown) to produce a uniform discharge. Although the cathode glow around the drum surface 71a or b connected during its negative half cycle can be adjusted to produce a uniform deposition, the opposing drum: 71a or b is anodic for that half cycle, and its deposit occurs in the strong electric field region on the area closest to the cathode. However, rotation of drums 71a, b then produces uniform coatings.

In tests, all analog and homolog molecules of silane, H$_2$ and the halogens were found to produce useful films as well as dopants and other film-forming gases available commercially.

Figure 7A:
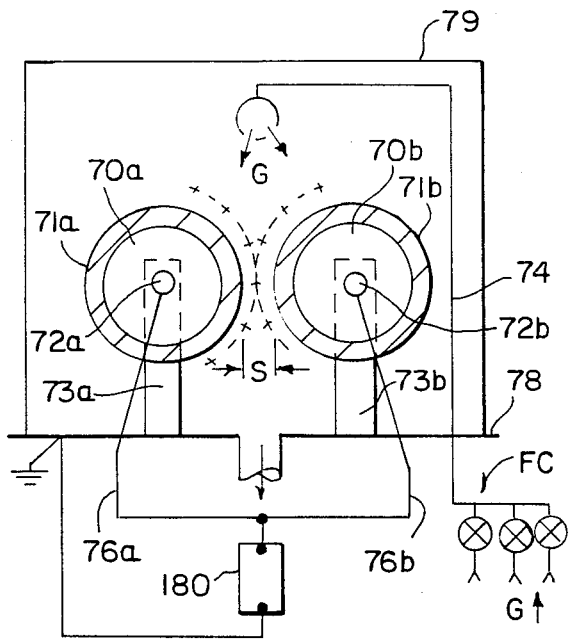

In addition, referring to FIG. 7A I found that when leads 76a, b electrically connected both the drums 70a, b to the negative terminal of D.C. power supply 180 while the positive terminal was connected to header 78 or metallic gas line 74, an improved glow discharge occurred to the drum surfaces 71a, b. Indeed, when the separation S between the surfaces 71a, b, as designated by "S" in FIG. 7A was varied and the current was maintained constant, the voltage required to sustain the glow discharge decreased when the separation S was adjusted so that the cathode glows above surfaces 71a, b approached one another. Under these conditions less power is required and better film quality in surfaces 71a, b was attained.

In operation, the heaviest deposit was noted to occur in the region of closest separation; however, nonuniformity in thickness was averaged out by rotation of drums a, b as shown.

Figure 8:
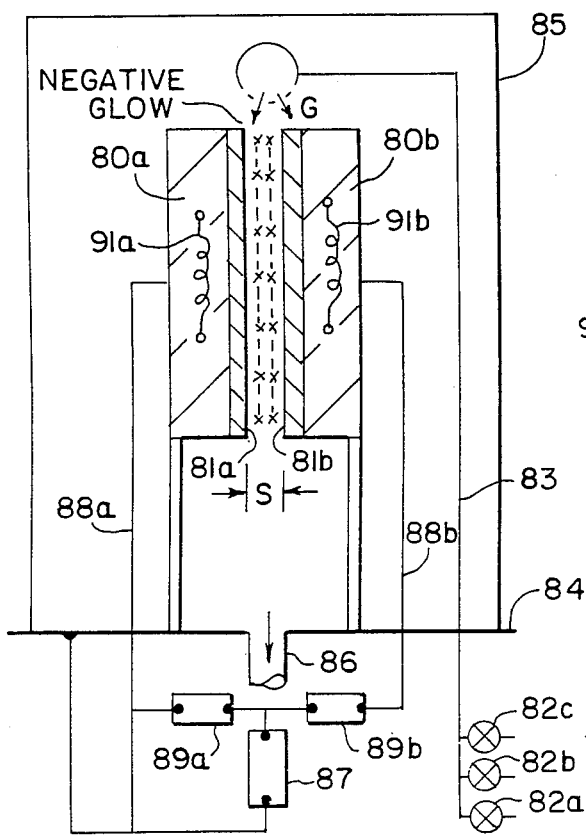
FIG. 8 is a side view in cross-section illustrating schematically glow discharge apparatus for coating planar members.

Next, referring to FIG. 8, the drums 70a, b illustrated in FIG. 7A were replaced with flat plate substrates 80a, b, having a separation S between opposing surfaces 81a, b. As described above, film forming gases from tanks (not shown) are admitted through flow controllers 82a, b, c, through line 83 in header 84 into the vicinity of substrate surfaces 81a, b. The enclosure 85 is pumped through line 86 by a vacuum pump (not shown) as described above. One terminal of a power supply 87 is connected through leads 88a, b to substrate 80a, b respectively, through protective impedances 89a, b. The other terminal of power supply 87 is connected to header or to gas supply lead 83 which acts as the counter electrode. Heaters 91a, b in substrates 80a, b are powered by an external power source (not shown) to maintain the desired substrate temperature, or an external source may radiantly heat substrates 80a, b.

In operation, the desired film forming gases such as, for example, silane and its dopants, as described in connection with FIG. 3, are admitted through line 83 into the enclosure 85. The power supply 87 may be pulsating D.C. with the most negative polarity connected through leads 88a, b to substrates 80a, b to maintain a glow discharge around substrate surfaces 81a, b. When the separation S is adjusted to position the negative glow regions above surfaces 81a, b in close proximity to one another, the voltage from power source 87 required to maintain the same current was observed to decrease. For example, using 4"×8" aluminum plate substrates 80a, b, and 5% silane in He at 2 Torr pressure, the voltage required to sustain 50 mA decreased from 360 to 340 volts when the separation S was decreased from 2 inches to 1 inch.

Under test, uniform films with good semiconductor properties were noted. Other gases gave similar results provided the cathode glows on the substrate surfaces were adjusted in close or overlapping proximity. (The effect was useful until the separation S was so small the glow discharge was extinguished.) Under such conditions, the apparatus illustrated in FIG. 8 was found to deposit improved a-Si:H films from silane, disilane, SiF$_4$, difluorosilane and various combinations of dopants including hydrogen, fluorine, diborane, phosphine and arsine. Other semiconductor gases found to deposit improved films included germane and trimethyl gallium with arsine.

In addition, when a silicon wafer was placed on surface 81 of electrode 80 in the apparatus illustrated in FIG. 8 and the reactive gases that are etchants of Si such as, for example, CH$_4$ and O$_2$, were introduced through tube 83, rapid etching of Si, SiO$_2$ and Si$_3$N$_4$ was observed under glow discharge. Also, BCl$_3$ was found to etch Al layers on Si. Introduction of O$_2$ alone was found to form SiO$_2$ on a Si wafer during a glow discharge and the addition of a few percent of CF$_4$ enhanced the oxidation rate. Although this etching reaction is similar to that known in the art, the apparatus of FIG. 8 was found to reduce the power required to operate in a stable manner at lower pressures and to produce better anisotropic etching than conventional parallel planar reactors or inductively coupled reactors.

Figure 9:
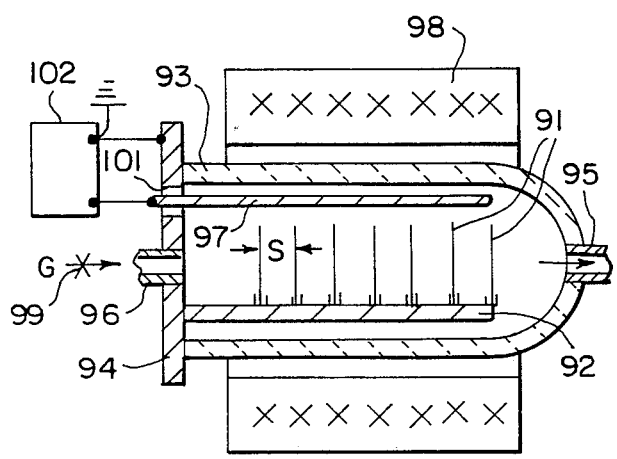
FIG. 9 is a cross-sectional of multiple planar substrates.

Referring to FIG. 9, substrates 91, such as Si wafers, are held in a conducting tray 92 which is electrically connected to header 94 and to IG. 9, substrates 91, such as Si wafers, are held in a conducting tray 92 which is electrically connected to header 94 and to ground. Header 94 forms a vacuum-tight enclosure with quartz tube 93 by means of a gasket (not shown). The conducting wafer tray 92 may be cantilevered from header 94. An IR oven 98 positioned around quartz tube 93 may be used to radiantly heat substrate 91. Gases G are admitted from tanks (not shown) and flow controller 99 through tubing 96 in header 94 and past substrates 91. The reaction by-products of gases G are exhausted through tubing 55 by a vacuum pump (not shown).

To provide an electric field to substrates 91, a counter electrode 97 in the form of nickel tubing is mounted on an electrical feed-through 101 in header 94. The center conductor of feed-through 101 may be connected to the positive terminal of a power supply 102, the negative terminal of which may be grounded to header 94.

Again, as described in connection with FIG. 7 and FIG. 8, the separation S between substrates 91 is adjusted for the desired pressure of gases G to maintain the cathode glow regions above juxtaposed surfaces of substrates 91 to be in sufficiently close proximity to interact and reduce the voltage required for deposition or etching. Substrates 91 may be of any desired material instead of the Si wafers and gases G may be any mentioned above or others, deposition or etching being determined by the gases G being used. Also, pulsating D.C., A.C., or R.F. power supplies may be used between substrates 91 and counter electrode 97, although the enhanced glow discharge only occurs during the portion of the voltage cycles in which substrates 91 are negative relative to counter electrode 97.

In addition to using the well known Carlson method of toning the electrostatic images on the photoreceptors, I found that by coating the photoreceptors illustrated in FIGS. 2-5 with a conventional thermoplastic polymer and corona charging, a physical image was produced in the polymer. Specifically, when the photoreceptor was exposed to a light image from, say, a laser beam, the surface charge was selectively discharged. The application of heat to the softening point of the polymer then permitted the portion of the surface which retained charge to physically deform in accordance with the charge pattern. The pattern was then read by a laser, as is known in the art.

Referring now to the cross-sectional view illustrated in FIG. 10, a pair of substrate cylinders 110, 114 are positioned concentrically around a center line CL with opposing surfaces 110', 114' separated by a distance S across which a glow discharge is maintained in which the negative glow regions interact. Counter electrodes 111a, b which are small-diameter tubes of, say, 1/16" stainless steel, are positioned co-axially in the gap distance S between cylinder surfaces 110', 114', and electrically connected by leads 108a, b, to power sources 117a, b through suitable feed-throughs in base plate 122. Leads 113a, b connect the common terminal of power sources 117a, b to cylinder 110 through 1" diameter stainless steel tube 104 and cylinder 112, which is in thermal and electrical contact with the inner surface of cylinder 110. Lead 113c connects the common terminal of power sources 117a, b through circuit element Z to cylinder 114, thereby completing the electrical circuit between the pair of substrate cylinders 110, 114, counter electrodes 111 and power sources 117a, b. Element Z may be shorted out in the preferred embodiment to connect cylinders 110, 114 to the same potential. Power supplies 117a, b may be D.C. or pulsating D.C., R.F. or bias R.F., as long as the negative glow regions of surfaces 110' and 114' interact to reduce the voltage.

A vacuum tight enclosure is formed in the apparatus of FIG. 7 by base plate 122 and bell jar 106. Film forming gases G are admitted from valves 16a . . . z through manifold 115, flow controllers FC, and tube 105 which has at least one exit aperture above cylinders 110, 114. When cylinder 110 is a photoreceptor drum and cylinder 114 is used only for its interactive negative glow, small diameter holes 124 in cylinder 114 may be provided to enable gas G to be inserted along into the gap S. Holes are found to be unnecessary in cylinder 124 for a 12" long cylinder 110 when multiple drums 110 are placed on shaft 112. Gases are exhausted through tubing 107 by means of a suitable pump and downstream flow controls in cooperation with the upstream flow controllers FC to maintain the desired pressure in enclosure 66.

Rotary motion may be applied to substrate 110 through the cylindrical shaft 104 which is mounted hermetically in base plate 122 by rotary seal 118. Shaft 104 is welded to end plates 112' of cylinder 112, thereby forming a vacuum-tight hollow chamber holding heating element 109 and providing convenient access to an external power supply (not shown) by leads (not shown) through tube 104. Hot fluids or coolants may be applied through shaft 104 as an alternative to electrical resistance heat. Thus the cylindrical enclosure 112 and shaft 104 illustrate one means for heating and rotating the substrate 110, although other mechanical arrangements are feasible within the spirit of the invention.

Operation of the apparatus illustrated in FIG. 10 is similar to that described in connection with FIGS. 7A, 8, in that in the preferred mode of operation, the pressure of gaseous mixture G and the dimensions of separation S are controlled to position the negative glow regions generated adjacent substrate surface 110' and inner cylinder surface 114' to interact cooperatively to reduce the voltage required to sustain the glow discharge. However, by positioning the counter electrodes 111a,b inside the separation S between surfaces 110', 114', I found that the glow discharge may be sustained at a lower pressure and that the material deposited on surface 110' of substrate 110 has fewer defects and improved photoconductive properties. For example, when substrate 110 is a 100 mm diameter aluminum drum for use in a Xerographic copier-printer such as that illustrated in FIG. 6, the inner diameter of substrate surface 114' is selected to provide the desired separation S. Typically, for values of S of 7/16" and 3/16" the minimum pressure of silane ($SiH_4$) to sustain the interactive glow discharge is 0.52 and 1.27 Torr respectively; however, the separation S may be from 0.01" to 1" or more with corresponding decrease in pressure. Useful currents without sparking range from 0.01 to 0.3 $mA/cm^2$ of substrate surface 110'. All such values of pressure are found to be lower for each separation S using apparatus such as that illustrated in FIG. 10 where the negative glow contacts the counter electrode than in apparatus such as is illustrated in FIG. 8 where the counter electrodes are positioned outside S. Counter electrodes 111 may be from ¼" or more in diameter down to 0.001″ or less, must be smaller in dimension than S, and may be fabricated from any metal such as stainless steel tubing and Cu or W wire. Deposition rates in the range of 5 to 50 microns/hour of a-Si:H with good electronic properties are attained. Indeed, when the pressure is adjusted to the minimum values necessary to sustain the discharge for an interactive negative glow between surfaces 110′ and 114′ for a particular S, a-Si:H devices are produced with a unique combination of semiconducting and photoconducting properties as described below in connection with FIGS. 18, 19.

FIG. 11 illustrates in cross-section an aluminum (Al) photoreceptor drum 120 coated with boron (B) bearing layer 121, an intrinsic a-Si:H layer 123 and a protective layer of silicon nitride (SiN) 125. The layer 121 may be formed by chemical vapor deposition (CVD) or plasma deposition of B and Si or by alloying B directly with the Al drum 120. The a-Si:H layer 123 is preferably deposited in the apparatus illustrated in FIG. 10, in which the drum substrate 120 represents a section of cylindrical substrate 110. Using the process conditions to attain an interactive negative glow as described above, an a-Si:H layer 123 was deposited to a thickness of 15 microns from pure silane on a B bearing layer 121 deposited to a thickness of 0.1 microns by CVD of $B_2H_6$ and $SiH_4$. No SiN layer 125 was used. When charged with a corona wire, the dark voltage $V_s = 350$ volts. White light and infrared IR discharged the layer 123 with a high quantum efficiency. When the drum 120 was inserted in a commercial copier such as a Royal 115, ideal copies were made repeatedly with less smudge between print than is present on copies made with a commercial selenium (Se) photoreceptor drum. Thus the a-Si:H layer 123 has lower residual voltage and little trapped charge after charging. The SiN layer 125 may be added as a protective coating to extend the life of the a-Si:H layer 123 and as an antireflective (AR) coating, but is not required.

Now, prior publications on a-Si:H photoreceptors such as those described by Shimizu, Komatzu and Inoue in their article which is referenced above report that at least 10 ppm of B doping (B-10) is required in intrinsic a-Si layers, even with various blocking layers. Such B doped a-Si:H drums, which are now sold commercially by a Japanese company, produce satisfactory copies as long as they are operated in a dry atmosphere; but, they are known to become inoperative when the relative humidity (RH) exceeds 80%. To partially deal with this problem, electrical heaters have been added to the core of the drum to reduce the RH inside the copier. Such heaters are expensive and add to the complexity of production and servicing. Thus, as the humidity problem is not present in my drums with intrinsic a-Si:H, higher quality copies may be made under adverse ambient conditions with less costly copier engines and the speed of photoreceptor response is substantially higher enabling the use of the a-Si:H photoconductor in new and unique electro-optic devices as described below.

Referring next to FIG. 12, the photoresponsive device on a transparent substrate 126, such as, for example, glass coated with $SnO_2$:F (to say 10 ohms/square) is illustrated in cross-section. A bottom $n^+$ layer 127 (1000 Å thick) is deposited by glow discharge to form contact to the $SnO_2$ glass 126 and an intrinsic a-Si:H layer 128 is deposited on top of layer 127. When the a-Si:H layer 128 is deposited in apparatus such as is illustrated in FIGS. 10 and 17, a unique combination of electrooptical properties are attained as illustrated below in FIGS. 13-16.

Referring now to FIG. 13, an electro-optic device was tested using 20 micron thick a-Si:H layers 128 in the diode structure illustrated in FIG. 12. The current I is plotted vs applied voltage on a log-log scale for a-Si plasma deposited at 250° C. (curve A) and 180° C (curve B). The radiation source was a 780 nM 1 microsecond ($\mu$sec) laser pulse through glass 126. Note that the photocurrent $I \sim V^3$ for curve A and, initially, for curve B $I \sim V$, i.e. ohmic, then $I \sim V^{2.5}$. Maximum values of voltages are 400 volts for A and 500 volts for B corresponding to 20 and 25 volts per micron of a-Si:H respectively. These current densities exceed 10 amps/cm². Dark voltages for samples A and B exceeded 40 volts per micron. Thus the a-Si:H is capable of switching high voltage and enables the use of thin a-Si:H for low voltages.

In both light and dark measurements on a-Si:H layer 128 illustrated in FIG. 13, the $+V$ terminal was applied to $n^+$ layer 127. When the $-V$ terminal of the voltage source was applied to layer 128, the current I was twice as high initially, but above 100 volts I was the same and maximum V before breakdown was reduced to 150 volts per micron. The I vs V data illustrated in FIG. 13 is typical of space-charge-limited dark currents in semi-insulating photoconductors as discussed by Rose in his aforementioned article, but such high-gain photocurrent has not been previously reported in a-Si:H. The high working stress and quality of my a-Si:H layer 128 of 20 volts per micron and above appears to account for these effects and enables new and unique electro-optic devices to be fabricated, as described below in FIGS. 18-19.

Referring next to FIG. 14, the residual current I vs time T after the intense IR illumination is removed, is plotted for the a-Si:H sample A used previously as layer 128 of the diode of FIG. 12. Sample C data was taken on a-Si:H doped with 10 ppm of B as discussed by Shimizu et al in the aforementioned reference. Note that $I \sim C$ $T^{-1}$ for A, while in the doped sample C $I \sim C T^{\frac{1}{2}}$, indicating my undoped sample A is substantially faster than doped sample C. Thus combining the high working stress with fast recovery of sample A, electro-optic switches capable of high data rates are feasible as discussed below in connection with FIGS. 18-19.

Although these effects are not completely understood, it appears as though the charge carriers n generated by the incident irradiation R decrease by recombination with trapping centers in accordance with the second-order rate equation:

$$dn/dT = CR - n^2/\tau$$

since in FIG. 14 curve A follows $I \sim T^{-1}$.

Referring to FIG. 15, a plot is made of the optical absorption coefficient $\alpha$ vs photon energy E for a-Si:H sample A of FIG. 13. The band-gap calculated from this plot is 1.78 ev (0.69 microns), but the sub band-gap levels off at about 0.4 cm$^{-1}$ at 1.1 ev. Such a low value corresponds to a density of gap states of about $5 \times 10^{15}$. This value is as low as any reported and indicates the high quality of the a-Si:H.

Referring to FIG. 16, a plot is made of the quantum efficiency QE vs wavelength $\lambda$ for a-Si:H sample A of FIG. 13. The solid curve was measured by dividing the saturated current I collected by the number of charge carriers when $+V$ was applied to the $n^+$ layer 127 shown in FIG. 12. The dashed line shows the QE when higher voltages approaching 20 volts/micron are applied. Thus, large gains are possible for wavelengths around the band-gap (0.69 microns).

On the other hand, the dotted curve in FIG. 16 was made with a low voltage of say 1 volt per micron between conductive contacts 127, 129 in the device of FIG. 12. The QE is low in the blue bands of λ even when illuminated through a semitransparent portion of contact 129. Low breakdown stress limits the response and renders a thick a-Si:H layer inoperable in the blue. Furthermore, adding B doping to a-Si:H in the range of 10 to 50 ppm raises the visible response.

Referring to FIG. 17, a pair of circular Al electrode substrates 171, 172 are positioned with a separation S to generate an interactive negative glow when an electric field is applied from counter electrode 173. A power source +V applies a potential to counter electrode 173, and electrodes 170, 172 are grounded through contacts 171, 176. A Si wafer substrate 170 is placed on electrode surface 170 in order to be coated or etched depending on the gas G introduced in the vicinity of electrodes 171, 172. The circular electrode 171 is rotated by shaft 174. Otherwise the apparatus and process steps are similar to that described in connection with FIGS. 7A, 10.

Referring to FIG. 18, a photoresponsive device is illustrated having co-planar Al electrodes 181 and 182 a–z evaporated on an insulating substrate 185. Electrodes 183a–z are separated from one another and from electrode 181 by gap 184 a–z. a-Si:H layer 180 is applied over electrodes 181, 182 by apparatus such as illustrated in FIGS. 7a, 17. In operation a radiation source such as an LED array 183 is placed over the gap 184 in order to induce photoconductivity as desired. Insulation (not shown) is applied to the exposed portion of electrode 181 except for a bottom contact pad. Electrode 181 may be used to initiate electronic circuits or to apply charge from a power source V on electrode 181 to a surface for electrophotography.

Referring to FIG. 19, a liquid crystal light valve is illustrated in which an a-Si:H layer 190 is coated on a $SnO_2$ transparent conductive layer 192 on glass plate 193. A $n^+$ layer 191 may be used as an ohmic contact between a-Si:H layer 190 and contact layer 192. A liquid crystal 197 is mounted between two surface treated layers 196, 198. Layer 196 is a portion of a dielectric mirror 195 and 198 is a portion of semitransparent contact layer 199 on glass fact plate 200. An IR filter 201 blocks IR from radiation source $R_2$ from reaching a-Si:H layer 190 while radiation source $R_1$ impinges on a-Si:H layer 190. Operation of the device is similar to that by Bleha referenced above, except that the a-Si:H is more sensitive and has faster response and relaxation than his photoconductors, thereby enabling operation at higher data rates from $R_1$.

I claim:

1. A photoreceptor comprising an electrically conductive substrate coated with a body comprising hydrogenated amorphous silicon wherein said body comprising hydrogenated amorphous silicon comprises a combination of electronic properties including a low optical sub band-gap absorption and high breakdown electrical stress in which said combination is substantially blocking to charge carriers present in the dark and is conducting to charge carriers generated under electromagnetic radiation.

2. A photoreceptor of the type described in claim wherein a layer comprising boron is interposed between at least a portion of said body comprising hydrogenated amorphous silicon and said conductive substrate.

3. A photoreceptor of the type described in claim 1 wherein said body comprising hydrogenated amorphous silicon is coated with an anti-reflection coating.

4. A photoreceptor of the type described in claim 1 wherein said body comprising hydrogenated amorphous silicon is coated with a transparent silicon alloy.

5. A photoresponsive device comprising a body comprising hydrogenated amorphous silicon having a first and second surface portion, said first surface portion contacting semitransparent conductive contact and said second surface portion contacting a second conductive contact, wherein said body comprising hydrogenated amorphous silicon comprises a combination of electronic properties including a low optical sub band-gap absorption and high breakdown electrical stress in which said combination is substantially blocking to charge carriers present in the dark and is conducting to charge carriers generated under electromagnetic radiation.

6. A photoresponsive device of the type described in claim 5 wherein an $n^+$ doped-layer is interposed between a portion of said body comprising hydrogenated amorphous silicon and one of said contacts to form a substantially ohmic contact between said body comprising hydrogenated amorphous silicon and said one of said contacts.

7. A photoresponsive device of the type described in claim 5 wherein a layer comprising boron is interposed between a portion of said body comprising hydrogenated amorphous silicon and one of said contacts.

8. A photoresponsive device of the type described in claim 5 wherein one of said contacts comprises an array of conductors.

9. A photoresponsive device of the type described in claim 5 wherein one of said contacts comprises a liquid crystal device.

10. A photoresponsive device of the type described in claim 5 wherein said electromagnetic radiation is generated by an light emitting diode.

11. A photoresponsive device of the type described in claim 5 wherein said electromagnetic radiation is generated by a pulsed laser.

12. Electrophotographic apparatus comprising in combination photoreceptor means having a photoreceptive surface, means for electrically charging said photoreceptive surface, means for selectively exposing said charged photoreceptive surface to electromagnetic radiation so that irradiated areas of said photoreceptive surface are selectively discharged, and means for developing an image on said photoreceptive surface corresponding to the selective exposure by electromagnetic radiation, wherein said photoreceptor means comprises an electrically conductive substrate means, a photoreceptor disposed upon the surface of an electrically conductive substrate, comprising: a body of hydrogenated amorphous silicon disposed upon the surface of said substrate, wherein said body comprising hydrogenated amorphous silicon comprises a combination of electronic properties including a low optical sub band-gap absorption and high breakdown electrical stress in which said combination is substantially blocking to charge carriers present in the dark and is conducting to charge carriers generated under electromagnetic radiation.

13. Electrophotographic apparatus of the type described in claim 12 wherein a layer comprising boron is interposed between said layer comprising hydrogenated amorphous silicon and said conductive substrate.

14. Electrophotographic apparatus comprising in combination a body of hydrogenated amorphous silicon having a first conductive contact applied to a first surface portion and a second conductive contact applied to a second surface portion, a power source in contact with said first contact of said body comprising hydrogenated amorphous silicon and an array of conductors in contact with said second surface portion to transfer charge to substrate, a modulated source of electromagnetic radiation impinging on said body comprising a-Si:H through a semitransparent portion of at least one of said contacts wherein said body comprising hydrogenated amorphous silicon comprises a combination of electronic properties including a low optical sub band-gap absorption and high breakdown electrical stress in which said combination is substantially blocking to charge carriers present in the dark and is conducting to charge carriers generated under electromagnetic radiation.

15. A liquid crystal light valve comprising in combination a body comprising hydrogenated amorphous silicon having a first and second surface portion and a body comprising a liquid crystal having a first and second surface portion wherein said first surface portion of said body of hydrogenated amorphous silicon is in electrical contact with said body comprising a liquid crystal, a source of modulated electromagnetic radiation impinging on said second surface portion of said body comprising hydrogenated amorphous silicon through a semitransparent conductive contact, a second source of electromagnetic radiation impinging on said liquid crystal, filter means for reducing selected bands of said second source of radiation and a voltage source applied between said second conductive contact on said body comprising hydrogenated amorphous silicon and said second surface of said body comprising a liquid crystal wherein said body comprising hydrogenated amorphous silicon comprises a combination of electronic properties including a low optical sub band-gap absorption and high breakdown electrical stress in which said combination is substantially blocking to charge carriers present in the dark and is conducting to charge carriers generated under electromagnetic radiation.

16. Apparatus for producing a film on the surfaces of a pair of substrates comprising an evacuable enclosure, means for evacuating said enclosure said pair of substrates separated from each other by a distance, means for introducing into the evacuated enclosure gas comprising silicon and hydrogen at subatmospheric pressure in the region of said pair of said substrates, counter electrode means positioned in the vicinity of said substrate surfaces for applying an electric field to said substrate surfaces within said enclosure, means for controlling the pressure to maintain the negative glow region of a glow discharge adjacent said substrate surfaces, the distance separating the said surfaces being sufficiently short that the negative glow regions of said surfaces interact with said counter electrode to reduce the pressure required to maintain the glow discharge.

17. Apparatus of the type described in claim 16 wherein one of said substrates comprises a cylindrical substrate, and further comprising means for rotating said cylindrical substrate about its axis so as to provide a uniform coating on the surface of said cylindrical substrate.

18. Apparatus of the type described in claim 16 wherein one of said substrates is a planar member.

19. The apparatus of claim 16 wherein heating means maintains the temperature of one of said substrates in a range to produce a high dark resistivity in said film.

20. The method of producing a film on a pair of substrate surfaces spaced apart by a separation in an evacuable enclosure, which includes the steps of evacuating said enclosure, introducing a gaseous material at subatmospheric pressure in the region of said pair of said substrates, applying an electric field between a counter electrode positioned in the vicinity of said pair of said substrate surfaces and said substrate surfaces and controlling said pressure within a minimum range of values in relation to said separation to maintain the negative glow region of a glow discharge adjacent the said surfaces of said substrates, the distance separating said substrates being sufficiently short that the negative glow regions of said surfaces interact to reduce the magnitude of said minimum pressure required to maintain the glow discharge.

21. The method of claim 20 further comprising the step of heating said pair of substrates to be coated.

22. The method of etching a pair of substrate surfaces spaced apart by a separation in an evacuable enclosure, which includes the steps of evacuating said enclosure, introducing a reactive gas at subatmospheric pressure in the region of said pair of said substrates, applying an electric field between a counter electrode positioned in the vicinity of said pair of said substrate surfaces and said substrate surfaces and controlling said pressure within a minimum range of values in relation to said separation to maintain the negative glow region of a glow discharge adjacent the said surfaces of said substrates, the distance separating said substrates being sufficiently short that the negative glow regions of said surfaces interact to reduce the magnitude of said minimum pressure required to maintain the glow discharge.

23. A photoreceptor of the type described in claim 1 wherein said combination of electronic properties includes a fast relaxation time.

24. A photoresponsive device of the type described in claim 5 wherein said combination of electronic properties includes a fast relaxation time.

25. Electrophotographic apparatus of the type described in claim 12 wherein said combination of electronic properties includes a fast relaxation time.

26. Electrophotographic apparatus of the type described in claim 14 wherein said combination of electronic properites includes a fast relaxation time.

27. A liquid crystal light valve of the type described in claim 15 wherein said combination of electronic properties includes a fast relaxation time.

* * * * *